United States Patent
Kobla et al.

(10) Patent No.: US 9,298,573 B2
(45) Date of Patent: Mar. 29, 2016

(54) BUILT-IN SELF-TEST FOR STACKED MEMORY ARCHITECTURE

(75) Inventors: Darshan Kobla, Austin, TX (US); David Zimmerman, Folsom, CA (US); Vimal K. Natarajan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 57 days.

(21) Appl. No.: 13/976,863

(22) PCT Filed: Mar. 30, 2012

(86) PCT No.: PCT/US2012/031438
§ 371 (c)(1),
(2), (4) Date: Jan. 14, 2014

(87) PCT Pub. No.: WO2013/147844
PCT Pub. Date: Oct. 3, 2013

(65) Prior Publication Data
US 2014/0164833 A1    Jun. 12, 2014

(51) Int. Cl.
*G06F 11/27* (2006.01)
*G11C 29/16* (2006.01)
(Continued)

(52) U.S. Cl.
CPC .............. *G06F 11/27* (2013.01); *G11C 29/16* (2013.01); *G11C 29/4401* (2013.01); *G11C 2029/0405* (2013.01); *G11C 2029/0407* (2013.01); *G11C 2029/4402* (2013.01)

(58) Field of Classification Search
CPC ..... G06F 11/27; G06F 11/1016; G06F 11/08; G06F 11/2273; G06F 11/263; G11C 29/16; G11C 29/10; G11C 29/12; G11C 29/04; G11C 2029/4402; G11C 2029/4401
See application file for complete search history.

(56) References Cited

U.S. PATENT DOCUMENTS

| | | | | |
|---|---|---|---|---|
| 5,961,653 | A | * 10/1999 | Kalter et al. | ............. 714/6.32 |
| 7,053,470 | B1 | 5/2006 | Sellers et al. | |
| 7,313,038 | B2 | 12/2007 | Otsuka | |

(Continued)

FOREIGN PATENT DOCUMENTS

| CN | 1499636 | 5/2004 |
|---|---|---|
| CN | 102113058 | 6/2011 |

(Continued)

OTHER PUBLICATIONS

International Search Report and Written Opinion of the International Searching Authority, International Patent Application No. PCT/US2012/031438, 9 pages.

(Continued)

*Primary Examiner* — Nadeem Iqbal
(74) *Attorney, Agent, or Firm* — Blakely, Sokoloff, Taylor & Zafman LLP

(57) ABSTRACT

A built-in self-test for stacked memory architecture. An embodiment of a memory device includes a memory stack including one or more DRAM (dynamic random access memory) elements; and a system element for control of the memory stack. The system element includes a built-in self-test (BIST) engine to generate a write test event or a read test event for the memory stack, a test interface to receive test data for write test event or the read test events from the BIST engine, and a memory controller, the memory control to receive at least a portion of the test data from the test interface and to implement the write test event or read test event at the DRAM elements of the memory stack.

21 Claims, 7 Drawing Sheets

(51) Int. Cl.
*G11C 29/44* (2006.01)
*G11C 29/04* (2006.01)

(56) References Cited

U.S. PATENT DOCUMENTS

| | | |
|---|---|---|
| 7,721,175 B2 * | 5/2010 | Resnick ............... 714/733 |
| 7,954,029 B2 * | 5/2011 | Resnick ............... 714/733 |
| 8,908,443 B1 | 12/2014 | Ellis |
| 2009/0059641 A1 | 3/2009 | Jeddeloh |
| 2009/0164846 A1 * | 6/2009 | Foster et al. ............ 714/30 |
| 2010/0195425 A1 * | 8/2010 | Urakawa et al. ........... 365/200 |
| 2010/0223512 A1 * | 9/2010 | Resnick ............... 714/718 |
| 2014/0013169 A1 * | 1/2014 | Kobla et al. ............ 714/718 |
| 2014/0013185 A1 * | 1/2014 | Kobla et al. ............ 714/768 |
| 2014/0177371 A1 | 6/2014 | Ellis et al. |
| 2014/0237307 A1 * | 8/2014 | Kobla et al. ............ 714/723 |

FOREIGN PATENT DOCUMENTS

| | | |
|---|---|---|
| JP | 2005-535978 | 11/2005 |
| JP | 2010-146191 | 7/2010 |
| JP | 2011-253607 | 12/2011 |

OTHER PUBLICATIONS

Office Action dated Jul. 7, 2015 (+ English translation), in Taiwan Patent Application No. 102108646, 18 pages.

Notice of Reasons for Rejection dated Sep. 15, 2015 (+ English translation), in Japanese Patent Application No. 2015-503171, 7 pages.

* cited by examiner

BUILT-IN SELF-TEST FOR STACKED MEMORY ARCHITECTURE

CROSS-REFERENCE TO RELATED APPLICATION

This application is a national phase of PCT/US2012/031438 filed Mar. 30, 2012, which application is incorporated herein by reference in its entirety.

TECHNICAL FIELD

Embodiments of the invention generally relate to the field of electronic devices and, more particularly, to built-in self-test for stacked memory architecture.

BACKGROUND

To provide more dense memory for computing operations, concepts involving memory devices (which may be referred to as 3D stacked memory, or stacked memory) having a plurality of closely coupled memory elements have been developed. A 3D stacked memory may include coupled layers or packages of DRAM (dynamic random-access memory) memory elements, which may be referred to as a memory stack. Stacked memory may be utilized to provide a great amount of computer memory in a single device or package, where the device or package may also include certain system components, such as a memory controller and CPU (central processing unit).

While stacked memory technology allows for providing memory devices for a wide variety of different devices, the stacked memory architecture creates additional cost and complexity in the manufacture of individual memory devices, as well as utilizing processes and structures that may generate defects in the memory devices.

However, the testing utilized for conventional memories may be inadequate for stacked memory devices, which include multiple interconnected memory layers controlled by a system element.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Figure 1:
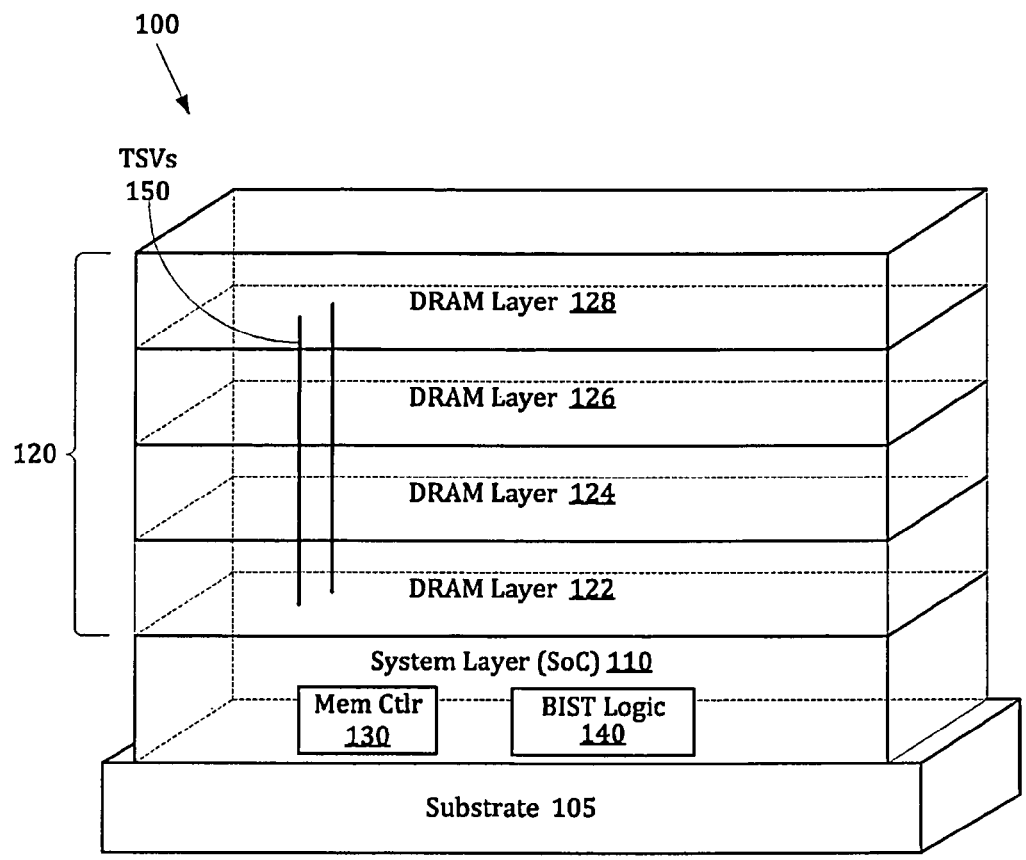
FIG. 1 illustrates an embodiment of a 3D stacked memory.

Embodiments of the invention are generally directed to built-in self-test for stacked memory architecture.

As used herein:

"3D stacked memory" (where 3D indicates three-dimensional) or "stacked memory" means a computer memory including multiple coupled memory layers, memory packages, or other memory elements. The memory may be vertically stacked or horizontally (such as side by side) stacked, or otherwise contain memory elements that are coupled together. In particular, a stacked memory DRAM device or system may include a memory device having a plurality of DRAM layers. A stacked memory device may also include system elements in the device, such as a CPU (central processing unit), a memory controller, and other related system elements.

In some embodiments, an apparatus, system, or method provides a built-in self-test interface for a stacked memory architecture. With the advent of a stacked DRAM standard (like WideIO) one or more DRAM wafers are stacked or otherwise coupled with a system on chip (SoC) wafer in the same package, with interconnections generated by through silicon via (TSV) manufacturing techniques. The combination of TSV and WideIO DRAM (and future memory standards) may result in area savings, platform power savings, and an increase in performance.

However, the assembling process and TSV manufacturing for stacked memory can potentially introduce defects, and the memory devices thus may require rigorous DRAM testing. In some embodiments, a BIST (Built-in self-test) engine of a memory system is used to test memories of the memory device. In some embodiments, an apparatus or system utilizes a BIST engine for a system chip that may then be utilized with little modification for DRAM testing.

DRAM is typically tested using direct test access, utilizing a supplier interface, using functional patterns, or using IO test engines. For traditional DRAMs that do not include TSVs in a stacked memory architecture, the need for testing of the DRAM memory cells may be minimal. However, factors such as TSV manufacturing processes and SOC thermal radiation may introduce defects or introduce reliability concerns in stacked DRAM architecture. In some embodiments, a dedicated BIST engine is provided to test DRAMs.

In some embodiments, a logic die includes test circuitry, where the memory device operates to take advantage of the logic die test circuitry to test DRAM of the memory device, such as one or more DRAM layers, such as DRAM layers above the logic die. In some embodiments, a memory device allows for leveraging and reusing the structures of the logic to test memory in the memory stack.

A BIST engine typically includes a controller and comparator logic that interfaces with the memory. A conventional BIST engine in a computer chip may include a controller that is capable of generating address and data to a memory for a given algorithm and comparator logic to compare against the expected data versus the actual data from the memory. The BIST controller is capable of generating address and data to the memory for a given algorithm. The comparator logic is to detect failures by comparing the expected data against the actual data from the memory. However, such a BIST engine is limited to the particular implementation and memory.

In some embodiments, read and write requests, addresses, and data (both write data and expected data in event of a read) are stored in a test data memory, such as a FIFO (first in, first out) memory, for operation with a BIST engine. In some embodiments, when the FIFO memory is full, the BIST engine is clock gated off. In some embodiments, state machine logic is implemented to fetch data from the FIFO memory and, based upon the fetched data, a write or read request is sent to memory controller. In some embodiments, logic may be included to encode the read and write requests in a format understandable to the memory controller. Once a given read or write transaction is complete, the state machine may fetch the next FIFO entry, if an additional entry if available.

A computer chip may include a BIST engine for the testing of memory on the chip, where such BIST engine would not generally understand DRAM memory. In some embodiments, BIST logic (such as chip logic that is reused for an extended purpose) is provided for self-test of a stacked memory architecture. In some embodiments, a BIST engine of the BIST logic, such as an existing BIST engine for the SoC of a memory device, utilizes the memory controller of the memory device to provide DRAM protocol implementation.

In some embodiments, the BIST logic includes a FIFO memory (or other test data memory element to store or transmit data) and state machine interface to the memory controller. In some embodiments, the BIST engine outputs the read and write requests, addresses, and data (both write data and expected data in event of a read) and the FIFO memory is implemented to store this information cycle by cycle. In some embodiments, the state machine logic is implemented to fetch from the FIFO memory, and a write or read request is sent to the memory controller. In some embodiments, comparator logic is provided that includes the FIFO memory and state machine in addition to operations to detecting failures. In some embodiments, logic may be added to encode the read and write requests in a format understandable to a memory controller. Once a given read/write transaction is complete the state machine fetches the next FIFO entry if available.

In some embodiments, a state machine may also be implemented to read two (or more) FIFO entries at a time such that back-to-back read-write, read-read, write-write, and write-read requests may be sent to the DRAM. In some embodiments, when the FIFO memory is full (or other similar status of the storage of the FIFO memory) or in event of a DRAM refresh, the BIST engine is clock gated off or otherwise disabled.

In a particular implementation, a BIST engine may generate a certain number of entries, generating addresses and the data for such operations. In some embodiments, the generated data is read cycle-by-cycle to fill up the FIFO memory, with a clock being disabled when the FIFO is full. In some embodiments, a state machine operates independently of the BIST engine, the state machine looking at or examining the FIFO and discovering entries, with fetch address and the enable. In some embodiments, the memory controller has or obtains data from the FIFO for testing operation for a memory in the required format, where the memory controller may have no information regarding the proper format for the DRAM. In some embodiments, during times when the memory controller is refreshing DRAM or is otherwise busy, the BIST engine may also be clock gated. In some embodiments, data is formatted in a manner that is compatible with the DRAM to implement for the tests, where formatting may in compatible with WideIO according to the JEDEC standard, or may be compatible with any existing or future standard for memory.

FIG. 1 illustrates an embodiment of a 3D stacked memory. In this illustration, a 3D stacked memory device 100, such as a WideIO memory device, includes a system element 110 on a substrate 105 coupled with one or more DRAM memory die layers 120, also referred to herein as the memory stack. In some embodiments, the system element 110 may be a system on chip (SoC) or other similar element. In this illustration, the DRAM memory die layers include four memory die layers, these layers being a first memory die layer 122, a second memory die layer 124, a third memory die layer 126, and a fourth memory die layer 128. However, embodiments are not limited to any particular number of memory die layers in the memory stack 120, and may include a greater or smaller number of memory die layers. Each die layer may include one or more slices or portions, and may have one or more different channels. Each die layer may include a temperature compensated self-refresh (TCSR) circuit to address thermal issues, where the TCSR and a mode register may be a part of management logic of the device.

Among other elements, the system element 110 may include a memory controller 130, such as a WideIO memory controller, for the memory stack 120. In some embodiments, each memory die layer (with the possible exception of the top (or outermost) memory die layer, such as the fourth memory die layer 128 in this illustration) of the memory stack 120 includes a plurality of through silicon vias (TSVs) 150 to provide paths through the memory die layers.

In some embodiments, the stacked memory device 100 includes BIST logic 140. In some embodiments, the BIST logic is utilized for the testing of the DRAM memory layers. In some embodiments, the BIST logic includes elements for the storage and handling of data and instructions for the testing of the DRAM, where such elements may include the element illustrated in FIG. 2 and FIG. 3.

Figure 2:
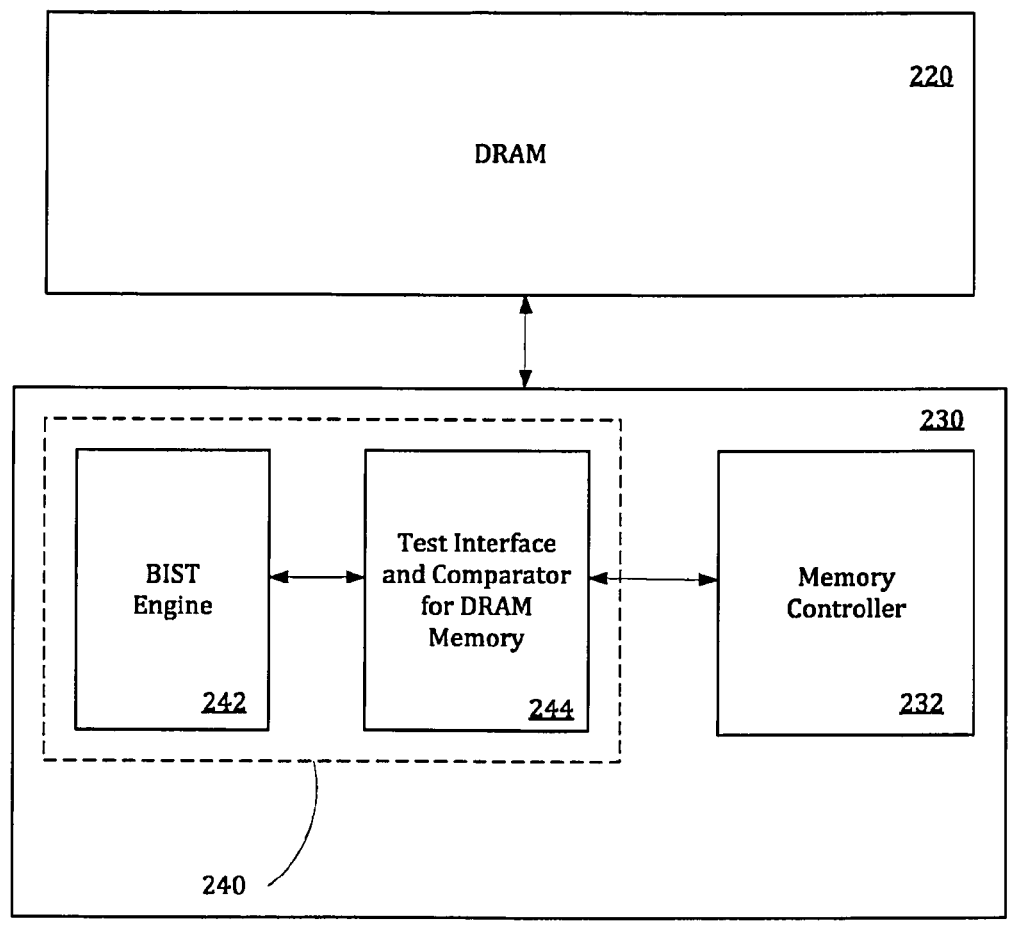
FIG. 2 illustrates an embodiment of a built-in self-test for a stacked memory architecture.

FIG. 2 illustrates an embodiment of a built-in self-test for a stacked memory architecture. In some embodiments, an SoC is 230 connected with DRAM memory 220. In some embodiments, the SoC 230 includes a memory controller 232 and BIST logic elements 240. In some embodiments, the logic elements 240 include a BIST engine 242 and test interface and comparator logic 244, wherein the test interface and comparator logic 244 is connected between the BIST engine and memory controller for the handling of data and instructions in the testing of the DRAM. In some embodiments, the test interface and comparator logic 244 includes components illustrated in FIG. 3.

Figure 3:
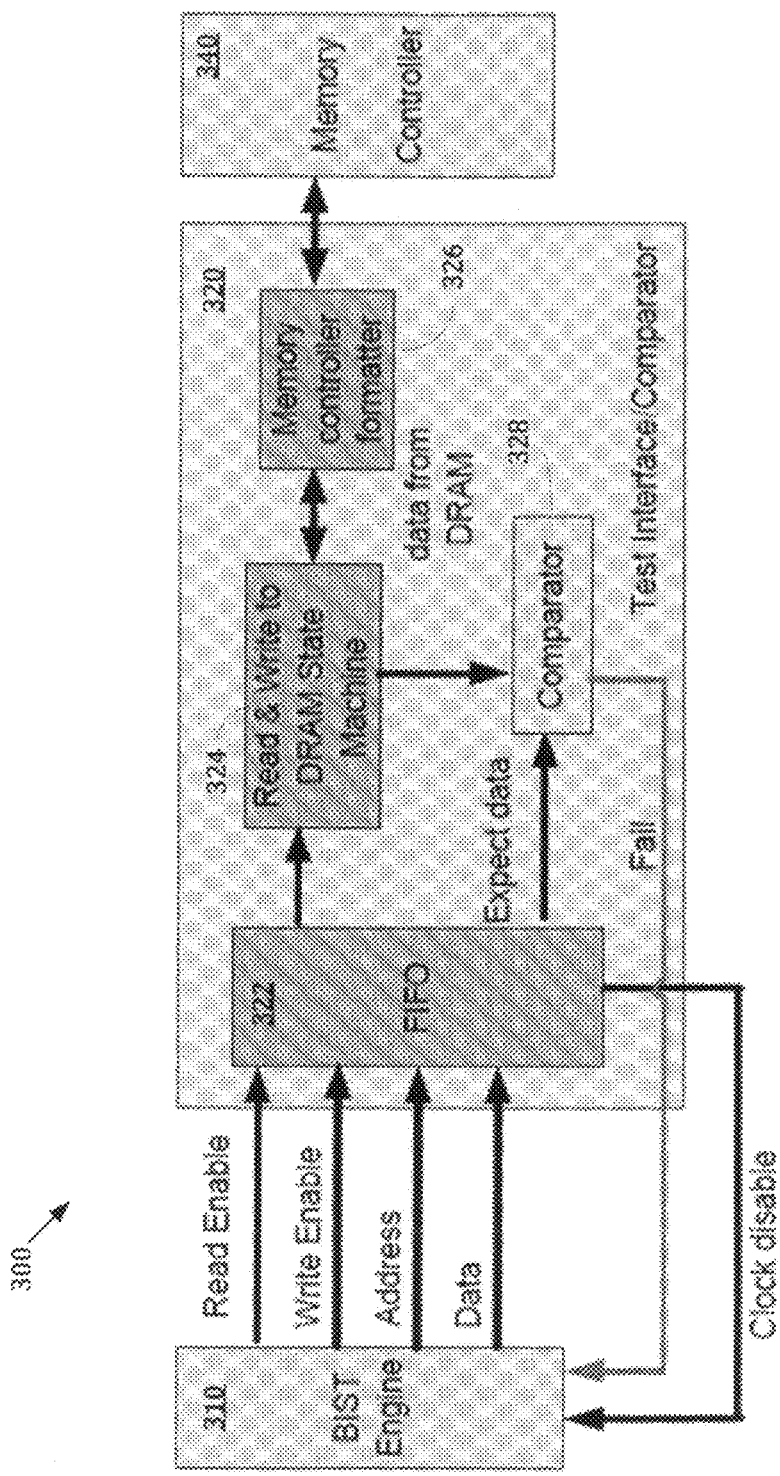
FIG. 3 illustrates components of an embodiment of a built-in self-test for a stacked memory architecture.

FIG. 3 illustrates components of an embodiment of a built-in self-test for a stacked memory architecture. In some embodiments, a chip 300 includes include a BIST engine 310 coupled with a test interface logic 320, which is in in turn coupled with a memory controller 340. In some embodiments, the test interface 320 includes a FIFO element 322, a read and write to DRAM state machine 324, a memory controller formatter 326, and a comparator 328. In some embodiments, the BIST engine 310 may be an existing BIST developed for testing of memory of the chip 300.

In some embodiments, the BIST engine 310 may generate test event data for the testing of DRAM memory, where the test event may be a write test event or a read test event. As illustrated, the test event data generated by the BIST engine 310 includes read enables, write enables, addresses, and data, where such elements are provided to the FIFO memory 322 for storage. In some embodiments, the FIFO memory 322 may provide a signal to the BIST engine 310 in response to a status of the FIFO memory, such as the FIFO memory being full, or in response to the memory controller being in self-refresh or otherwise busy, where such signal may include, but is not limited to, the illustrated clock disable signal from the FIFO to the BIST engine. In some embodiments, the signal is to disable the clock for the BIST engine such that no more instructions are sent until there is storage in the FIFO memory or the memory controller is available. In some embodiments, the test data for a read or write operation, comprising a read or write enable, address, and test data, is obtained from the FIFO memory by the state machine 324, where such testing information is provided to the memory controller formatter 326 to format the testing information into a format that is compatible with DRAM memory elements under test, such as in a WideIO format for a stacked memory device. In some embodiments, the memory controller 340 directs the formatted testing information to the DRAM memory elements.

In some embodiments, the memory controller 340 may obtain data read from the DRAM for comparison in testing, the memory controller providing such data to the memory controller formatter 326, which may operate to modify the data format for comparison. In some embodiments, the state machine 324 may obtain the data read from DRAM from the memory controller formatter 326 and provide such data to the comparator 328, where the comparator operates to compare the data from the DRAM with expected data values obtained from the FIFO memory 322. In some embodiments, the comparator 328 is to generate results based on the comparison of data from the DRAM with the expected data, which may include, for example, a fail signal provided by the comparator 328 to the BIST engine 310. However, embodiments are not limited to implementations in which a fail signal is provided. Other embodiments may include other or additional results data regarding the comparison of the data from the DRAM with the expected data.

Figure 4A:
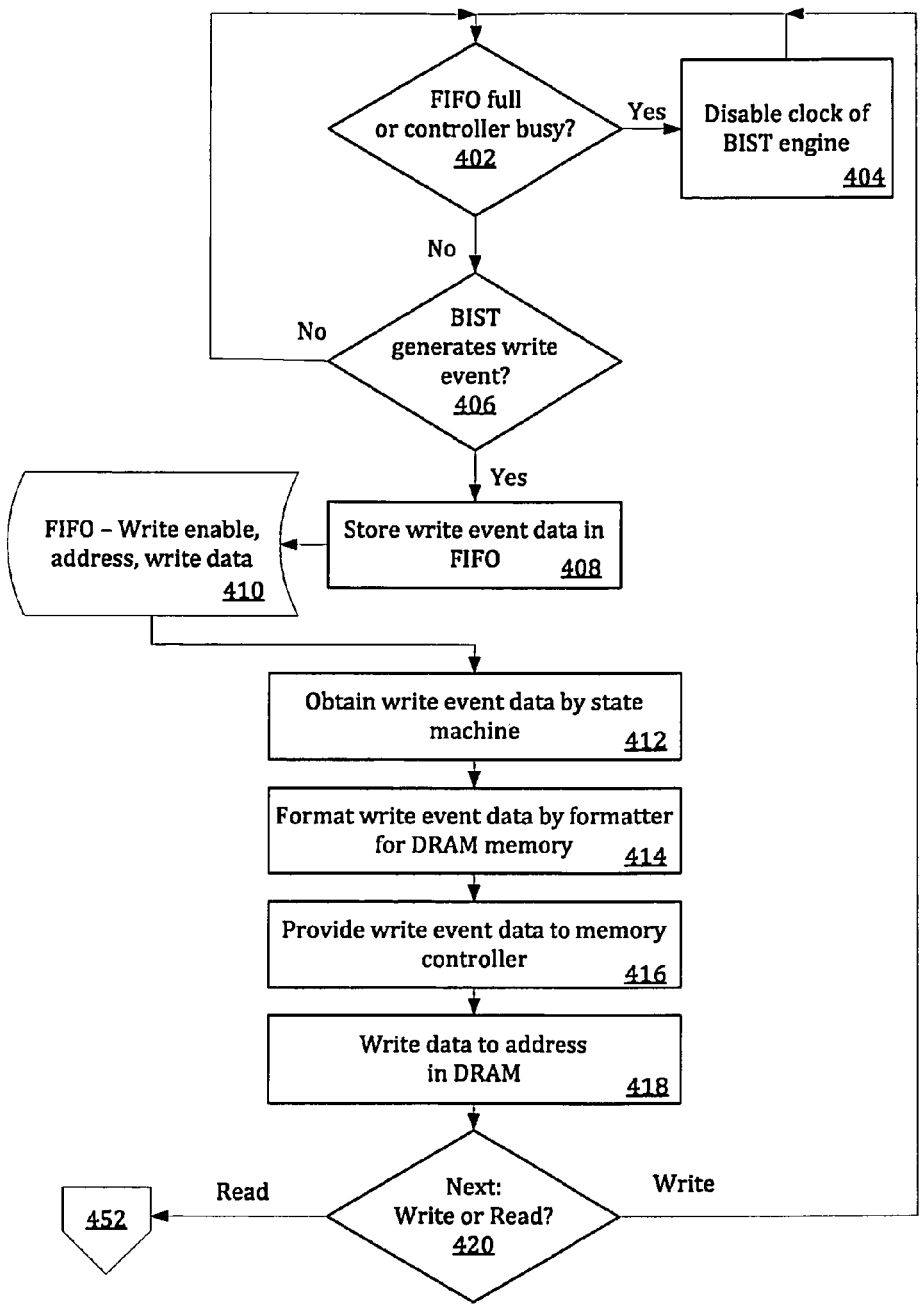
FIG. 4A is a flowchart to illustrate an embodiment of a data write self-test process for a stacked memory.

FIG. 4A is a flowchart to illustrate an embodiment of a data write self-test process for a stacked memory. In some embodiments, if a FIFO memory is full (or reaches a storage threshold) or the memory controller is busy 402, a clock disable signal may be provided by the FIFO memory to disable the clock of a BIST engine 404 to prevent the storing of any further read or write events in the FIFO memory until the space is available in the FIFO memory or the memory controller is available. In some embodiments, if the BIST engine generates a write event 406, then write event data is stored in the FIFO memory 408, the write event data including a write enable, an address for writing data, and write data to be written to the DRAM memory 410.

In some embodiments, data for the write event is to be obtained by a read and write to DRAM state machine 412, the write event data to be formatted by a formatter to put the information in a form compatible with the DRAM memory under test for the use of the memory controller 414. In some embodiments, the formatted write event information is provided to the memory controller 416, and the write data is written to the address of the DRAM 418.

Figure 4B:
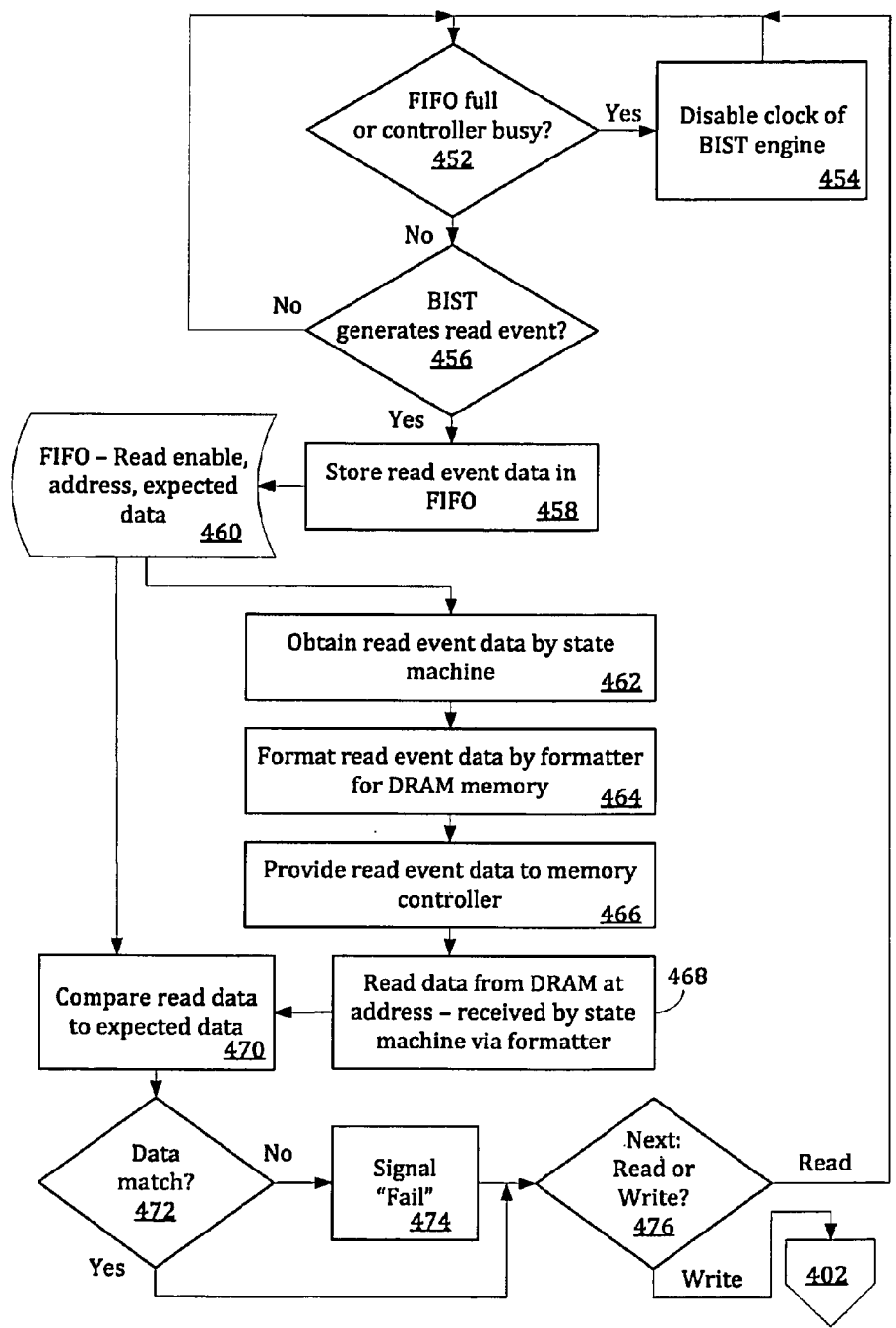
FIG. 4B is a flowchart to illustrate an embodiment of a data read self-test process for a stacked memory.

In some embodiments, the write event may be followed 420 by another write test event as illustrated in FIG. 4A, returning to 402, or by a read event illustrated in FIG. 4B, at element 452 of FIG. 4B.

FIG. 4B is a flowchart to illustrate an embodiment of a data read self-test process for a stacked memory. In some embodiments, if a FIFO memory is full (or reaches a storage threshold) or the memory controller is busy 452, a clock disable signal may be provided by the FIFO memory to disable the clock of a BIST engine 454 to prevent the storing of any further read or write events in the FIFO memory until the space is available in the FIFO memory or until the memory controller is available. In some embodiments, if the BIST engine generates a read event 456, then read event data is stored in the FIFO memory 458, the read event data including a read enable, an address for reading data, and expected data to be compared to data read from the DRAM memory 460.

In some embodiments, data for the read event is to be obtained by a read and write to DRAM state machine 462, the read event data to be formatted by a formatter to put the information in a form compatible with the DRAM memory under test for use by the memory controller 464. In some embodiments, the formatted read event information is provided to the memory controller 466, and the data is read from the address of the DRAM, and the read data is received by the state machine via the formatter 468.

In some embodiments, the data read from the DRAM is compared by a comparator with expected data received from the FIFO memory 470. If the data read from the DRAM does not match the expected data 472, a signal is made, such as a signal indicating "Fail" for the comparison 474, where the signal may be provided from the comparator to the BIST engine.

In some embodiments, the write event may be followed 476 by another read test event as illustrated in FIG. 4B, returning to 452, or by a write event illustrated in FIG. 4A, at element 402 of FIG. 4A.

Figure 5:
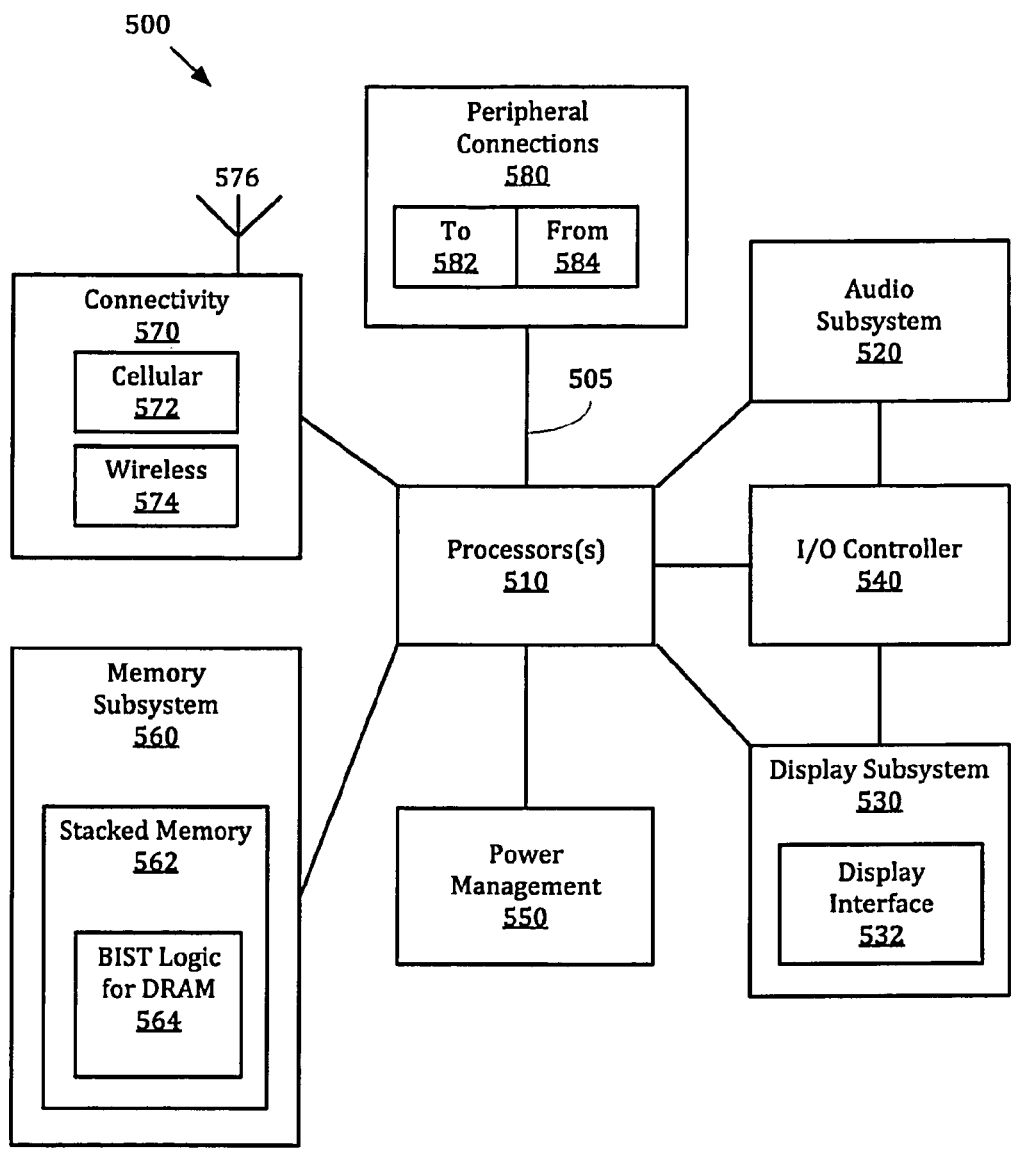
FIG. 5 is an illustration of an embodiment of an apparatus or system including elements for a stacked memory built-in self-test.

FIG. 5 is an illustration of an, embodiment of an apparatus or system including elements for a stacked memory built-in self-test. Computing device 500 represents a computing device including a mobile computing device, such as a laptop computer, a tablet computer (including a device having a touchscreen without a separate keyboard; a device having both a touchscreen and keyboard; a device having quick initiation, referred to as "instant on" operation; and a device that is generally connected to a network in operation, referred to as "always connected"), a mobile phone or smart phone, a wireless-enabled e-reader, or other wireless mobile device. It will be understood that certain of the components are shown generally, and not all components of such a device are shown in device 500. The components may be connected by one or more buses or other connections 505.

Device 500 includes processor 510, which performs the primary processing operations of device 500. Processor 510 can include one or more physical devices, such as microprocessors, application processors, microcontrollers, programmable logic devices, or other processing means. The processing operations performed by processor 510 include the execution of an operating platform or operating system on which applications, device functions, or both are executed. The processing operations include operations related to I/O (input/output) with a human user or with other devices, operations related to power management, operations, or both related to connecting device 500 to another device. The processing operations may also include operations related to audio I/O, display I/O, or both.

In one embodiment, device 500 includes audio subsystem 520, which represents hardware (such as audio hardware and audio circuits) and software (such as drivers and codecs) components associated with providing audio functions to the computing device. Audio functions can include speaker, headphone, or both such audio output, as well as microphone input. Devices for such functions can be integrated into device 500, or connected to device 500. In one embodiment, a user interacts with device 500 by providing audio commands that are received and processed by processor 510.

Display subsystem 530 represents hardware (such as display devices) and software (such as drivers) components that provide a display having visual, tactile, or both elements for a user to interact with the computing device. Display subsystem 530 includes display interface 532, which includes the particular screen or hardware device used to provide a display to a user. In one embodiment, display interface 532 includes logic separate from processor 510 to perform at least some processing related to the display. In one embodiment, display subsystem 530 includes a touch screen device that provides both output and input to a user.

I/O controller 540 represents hardware devices and software components related to interaction with a user. I/O controller 540 can operate to manage hardware that is part of audio subsystem 520, a display subsystem 530, or both such subsystems. Additionally, I/O controller 540 illustrates a connection point for additional devices that connect to device 500 through which a user might interact with the system. For example, devices that can be attached to device 500 might include microphone devices, speaker or stereo systems, video systems or other display device, keyboard or keypad devices, or other I/O devices for use with specific applications such as card readers or other devices.

As mentioned above, I/O controller 540 may interact with audio subsystem 520, display subsystem 530, or both such subsystems. For example, input through a microphone or other audio device can provide input or commands for one or more applications or functions of device 500. Additionally, audio output can be provided instead of or in addition to display output. In another example, if display subsystem includes a touch screen, the display device also acts as an input device, which can be at least partially managed by I/O controller 540. There can also be additional buttons or switches on device 500 to provide I/O functions managed by I/O controller 540.

In one embodiment, I/O controller 540 manages devices such as accelerometers, cameras, light sensors or other environmental sensors, or other hardware that can be included in device 500. The input can be part of direct user interaction, as well as providing environmental input to the system to influence its operations (such as filtering for noise, adjusting displays for brightness detection, applying a flash for a camera, or other features).

In one embodiment, device 500 includes power management 550 that manages battery power usage, charging of the battery, and features related to power saving operation.

In some embodiments, memory subsystem 560 includes memory devices for storing information in device 500. The processor 510 may read and write data to elements of the memory subsystem 560. Memory can include nonvolatile (having a state that does not change if power to the memory device is interrupted), volatile (having a state that is indeterminate if power to the memory device is interrupted) memory devices, or both such memories. Memory 560 can store application data, user data, music, photos, documents, or other data, as well as system data (whether long-term or temporary) related to the execution of the applications and functions of system 500.

In some embodiments, the memory subsystem 560 may include a stacked memory device 562, where the stacked memory device includes one or more memory die layers and a system element. In some embodiments, the stacked memory device 562 include BIST logic for the testing of DRAM 564, where the BIST logic 564 may include elements illustrated in FIGS. 2 and 3.

Connectivity 570 includes hardware devices (e.g., connectors and communication hardware for wireless communication, wired communication, or both) and software components (e.g., drivers, protocol stacks) to enable device 500 to communicate with external devices. The device could be separate devices, such as other computing devices, wireless access points or base stations, as well as peripherals such as headsets, printers, or other devices.

Connectivity 570 can include multiple different types of connectivity. To generalize, device 500 is illustrated with cellular connectivity 572 and wireless connectivity 574. Cellular connectivity 572 refers generally to cellular network connectivity provided by wireless carriers, such as provided via 4G/LTE (Long Term Evolution), GSM (global system for mobile communications) or variations or derivatives, CDMA (code division multiple access) or variations or derivatives, TDM (time division multiplexing) or variations or derivatives, or other cellular service standards. Wireless connectivity 574 refers to wireless connectivity that is not cellular, and can include personal area networks (such as Bluetooth), local area networks (such as WiFi), wide area networks (such as WiMax), and other wireless communications. Connectivity may include one or more omnidirectional or directional antennas 576.

Peripheral connections 580 include hardware interfaces and connectors, as well as software components (e.g., drivers, protocol stacks) to make peripheral connections. It will be understood that device 500 could both be a peripheral device ("to" 582) to other computing devices, as well as have peripheral devices ("from" 584) connected to it. Device 500 commonly has a "docking" connector to connect to other computing devices for purposes such as managing (such as downloading, uploading, changing, or synchronizing) content on device 500. Additionally, a docking connector can allow device 500 to connect to certain peripherals that allow device 500 to control content output, for example, to audiovisual or other systems.

In addition to a proprietary docking connector or other proprietary connection hardware, device 500 can make peripheral connections 580 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

Figure 6:
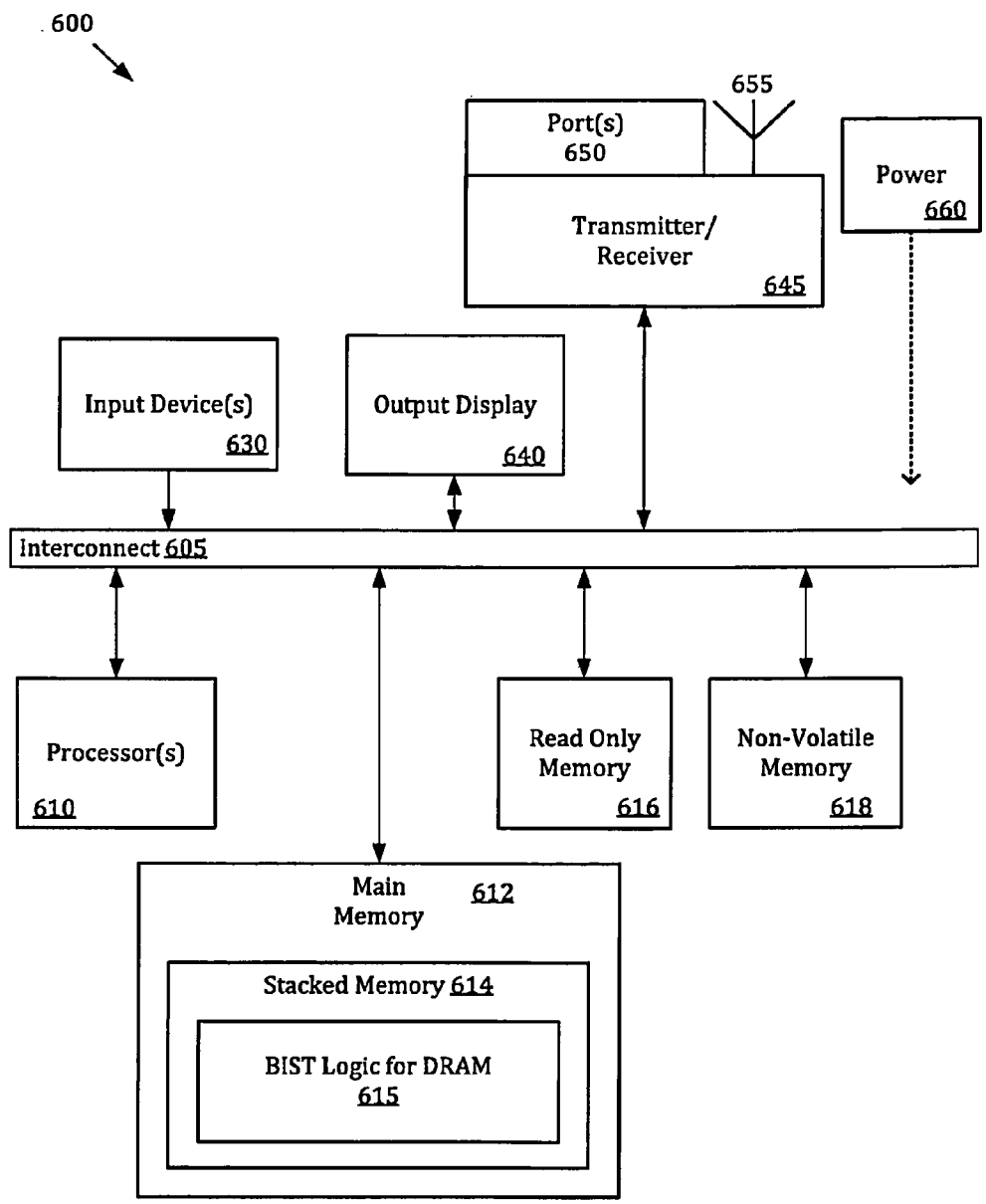
FIG. 6 illustrates an embodiment of a computing system including stacked memory having elements a build-in self-test.

FIG. 6 illustrates an embodiment of a computing system including stacked memory having elements a build-in self-test. The computing system may include a computer, server, game console, or other computing apparatus. In this illustration, certain standard and well-known components that are not germane to the present description are not shown. Under some embodiments, the computing system 600 comprises an interconnect or crossbar 605 or other communication means for transmission of data. The computing system 600 may include a processing means such as one or more processors 610 coupled with the interconnect 605 for processing information. The processors 610 may comprise one or more physical processors and one or more logical processors. The interconnect 605 is illustrated as a single interconnect for simplicity, but may represent multiple different interconnects or buses and the component connections to such interconnects may vary. The interconnect 605 shown in FIG. 6 is an abstraction that represents any one or more separate physical buses, point-to-point connections, or both connected by appropriate bridges, adapters, or controllers.

In some embodiments, the computing system 600 further comprises a random access memory (RAM) or other dynamic storage device or element as a main memory 612 for storing information and instructions to be executed by the processors 610. RAM memory includes dynamic random access memory (DRAM), which requires refreshing of memory contents, and static random access memory (SRAM), which does not require refreshing contents, but at increased cost. In some embodiments, main memory may include active storage of applications including a browser application for using in network browsing activities by a user of the computing system. DRAM memory may include synchronous dynamic random access memory (SDRAM), which includes a clock signal to control signals, and extended data-out dynamic random access memory (EDO DRAM). In some embodiments, memory of the system may include certain registers or other special purpose memory.

In some embodiments, the main memory 612 includes stacked memory 614, wherein the stacked memory includes BIST logic for the testing of DRAM 615. In some embodiments, the BIST logic 615 may include elements illustrated in FIGS. 2 and 3.

The computing system 600 also may comprise a read only memory (ROM) 616 or other static storage device for storing static information and instructions for the processors 610. The computing system 600 may include one or more non-volatile memory elements 618 for the storage of certain elements.

In some embodiments, the computing system 600 includes one or more input devices 630, where the input devices include one or more of a keyboard, mouse, touch pad, voice command recognition, gesture recognition, or other device for providing an input to a computing system.

The computing system 600 may also be coupled via the interconnect 605 to an output display 640. In some embodiments, the display 640 may include a liquid crystal display (LCD) or any other display technology, for displaying information or content to a user. In some environments, the display 640 may include a touch-screen that is also utilized as at least a part of an input device. In some environments, the display 640 may be or may include an audio device, such as a speaker for providing audio information.

One or more transmitters or receivers 645 may also be coupled to the interconnect 605. In some embodiments, the computing system 600 may include one or more ports 650 for the reception or transmission of data. The computing system 600 may further include one or more omnidirectional or directional antennas 655 for the reception of data via radio signals.

The computing system 600 may also comprise a power device or system 660, which may comprise a power supply, a battery, a solar cell, a fuel cell, or other system or device for providing or generating power. The power provided by the power device or system 660 may be distributed as required to elements of the computing system 600.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form. There may be intermediate structure between illustrated components. The components described or illustrated herein may have additional inputs or outputs that are not illustrated or described.

Various embodiments may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

Portions of various embodiments may be provided as a computer program product, which may include a non-transitory computer-readable storage medium having stored thereon computer program instructions, which may be used to program a computer (or other electronic devices) for execution by one or more processors to perform a process according to certain embodiments. The computer-readable medium may include, but is not limited to, floppy diskettes, optical disks, compact disk read-only memory (CD-ROM), and magneto-optical disks, read-only memory (ROM), random access memory (RAM), erasable programmable read-only memory (EPROM), electrically-erasable programmable read-only memory (EEPROM), magnet or optical cards, flash memory, or other type of computer-readable medium suitable for storing electronic instructions. Moreover, embodiments may also be downloaded as a computer program product, wherein the program may be transferred from a remote computer to a requesting computer.

Many of the methods are described in their most basic form, but processes can be added to or deleted from any of the methods and information can be added or subtracted from any of the described messages without departing from the basic scope of the present invention. It will be apparent to those skilled in the art that many further modifications and adaptations can be made. The particular embodiments are not provided to limit the invention but to illustrate it. The scope of the embodiments of the present invention is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example of the present invention. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments of the present invention, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims are hereby expressly incorporated into this description, with each claim standing on its own as a separate embodiment of this invention.

In some embodiments, a memory device includes a memory stack including one or more DRAM elements; and a system element for control of the memory stack, the system element including BIST engine to generate a write test event or a read test event for the memory stack, a test interface to receive test data for write test event or the read test events from the BIST engine, and a memory controller. The memory control is to receive at least a portion of the test data from the test interface and to implement the write test event or read test event at the DRAM elements of the memory stack.

In some embodiments, the test data for a write test event includes a write enable, a memory address to be written to, and a data to be written at the memory address. In some embodiments, the test data for a read test event includes a read enable, a memory address to be read from, and an expected data for comparison.

In some embodiments, the test interface of the apparatus includes a test data memory for the storage of the test data for a write test event or a read test event, wherein the test data memory may be a FIFO memory. In some embodiments, the test data memory is to provide a signal to the BIST engine in response to a status of the storage of the memory or a status of the memory controller. In some embodiments, the signal is a clock disable signal for the BIST engine.

In some embodiments, the test interface of the apparatus further includes a state machine, the state machine to obtain at least a part of the test data for a write test event or a read test event from the memory. In some embodiments, the state machine is to provide the at least a part of the test data for a write test event or a read test event to a formatter, the formatter to format the test data for the DRAM memory.

In some embodiments, the test interface of the apparatus further includes a comparator, the comparator to compare a data obtained from the memory stack in response to a read test event with an expected data. In some embodiments, the comparator is to generate a signal in response to a comparison of obtained data with expected data. In some embodiments, the signal is a signal to the BIST engine to indicate a failure of the comparison.

In some embodiments, a method includes generating a test event by a BIST engine of a system element, the test event being a read test event or a write test event for a DRAM memory of a memory device; receiving the test data at a test interface of the system element; providing at least a portion of the test data to a memory controller of the memory device; and implementing the test event by the memory controller.

In some embodiments, receiving the test data at the test interface includes storing the test data in a test data memory.

In some embodiments, the method includes providing a signal to the BIST engine in response to a status of the storage of the memory or a status of the memory controller, where the signal may be a clock disable signal for the BIST engine.

In some embodiments, the method further includes formatting the at least a portion of the test data prior to providing the at least a portion of the test data to the memory controller, wherein the formatting is in a format compatible with the DRAM memory.

In some embodiments, the method includes receiving at the test interface data read by memory controller from the DRAM memory in response to a read test event. In some embodiments, the method includes comparing the data read from the DRAM memory to an expected value for the data stored in the test data memory.

In some embodiments, a system includes a processor for processing data; a flash memory for storing data; and a DRAM device including a memory stack including one or more DRAM elements, and a system element for control of the memory stack, the system element including a built-in self-test (BIST) engine to generate a write test event or a read test event for the memory stack, a test interface to receive test data for write test event or the read test events from the BIST engine, and a memory controller, the memory control to receive at least a portion of the test data from the test interface and to implement the write test event or read test event at the DRAM elements of the memory stack.

In some embodiments, the test interface of the system includes a test data memory for the storage of the test data for a write test event or a read test event, where the test data memory may be a FIFO memory. In some embodiments, the test interface of the system further includes a state machine, the state machine to obtain at least a part of the test data for a write test event or a read test event from the DRAM. In some embodiments, the test interface of the system further includes a comparator, the comparator to compare a data obtained from the memory stack in response to a read test event with an expected data.

In some embodiments, the system is a tablet computer.

In some embodiments, a non-transitory computer-readable storage medium having stored thereon data representing sequences of instructions that, when executed by a processor, cause the processor to perform operations including generating a test event by a built-in self-test (BIST) engine of a system element, the test event being a read test event or a write test event for a DRAM memory of a memory device; receiving the test data at a test interface of the system element; providing at least a portion of the test data to a memory controller of the memory device; and implementing the test event by the memory controller.

In some embodiments, the medium includes instructions for formatting the at least a portion of the test data prior to providing the at least a portion of the test data to the memory controller, wherein the formatting is in a format compatible with the DRAM memory.

In some embodiments, the medium includes instructions for receiving at the test interface data read by memory controller from the DRAM memory in response to a read test event.

In some embodiments, the medium includes instructions for comparing the data read from the DRAM memory to an expected value for the data stored in a test data memory.

What is claimed is:

1. A memory device comprising:
a memory stack including one or more DRAM (dynamic random access memory) elements; and
a system element for control of the memory stack, the system element including:
a built-in self-test (BIST) engine to generate a write test event or a read test event for the memory stack,
a test interface to receive test data for write test event or the read test events from the BIST engine, wherein the test interface includes:
a test data memory to store the test data for a write test event or a read test event; and
a state machine to obtain at least a part of the test data for a write test event or a read test event from the test data memory, the state machine to provide the at least a part of the test data for a write test event or a read test event to a formatter of the test interface, the formatter to format the test data for the DRAM elements to generate formatted test data, and
a memory controller, the memory controller to receive the formatted test data from the test interface and to implement the write test event or read test event at the DRAM elements of the memory stack.

2. The memory device of claim 1, where the test data for a write test event includes a write enable, a memory address to be written to, and a data to be written at the memory address.

3. The memory device of claim 1, wherein the test data for a read test event includes a read enable, a memory address to be read from, and an expected data for comparison.

4. The memory device of claim 1, wherein the test data memory is a FIFO (first in first out) memory.

5. The memory device of claim 1, wherein the test interface is to provide a signal to the BIST engine in response to a status of the storage of the memory stack or a status of the memory controller.

6. The memory device of claim 5, wherein the signal provided by the test interface is a clock disable signal for the BIST engine.

7. The memory device of claim 1, wherein the test interface further includes a comparator, the comparator to compare a data obtained from the memory stack in response to a read test event with an expected data.

8. The memory device of claim 7, wherein the comparator is to generate a signal in response to a comparison of obtained data with expected data.

9. The memory device of claim 8, wherein the signal generated by the comparator is a signal to the BIST engine to indicate a failure of the comparison.

10. A method comprising:
    generating a test event by a built-in self-test (BIST) engine of a system element, the test event being a read test event or a write test event for a DRAM (dynamic random access memory) memory of a memory device;
    receiving the test data at a test interface of the system element, the test interface including a test data memory;
    storing the test data in the test data memory;
    obtaining from the test data memory by a state machine at least a portion of the test data for a write test event or a read test event;
    formatting the at least a portion of the test data in a format compatible with the DRAM memory to generate formatted test data;
    providing the formatted test data to a memory controller of the memory device; and
    implementing the write test event or read test event by the memory controller.

11. The method of claim 10, further comprising providing a signal to the BIST engine in response to a status of the storage of the memory or a status of the memory controller.

12. The method of claim 11, where the signal is a clock disable signal for the BIST engine.

13. The method of claim 11, further comprising receiving at the test interface data read by the memory controller from the DRAM memory in response to a read test event.

14. The method of claim 13, further comprising comparing the data read from the DRAM memory to an expected value for the data stored in the test data memory.

15. A system comprising:
    a processor to process data;
    a flash memory to store data; and
    a DRAM (dynamic random access memory) device comprising:
        a memory stack including one or more DRAM elements; and
        a system element for control of the memory stack, the system element including:
            a built-in self-test (BIST) engine to generate a write test event or a read test event for the memory stack,
            a test interface to receive test data for write test event or the read test events from the BIST engine, wherein the test interface includes:
                a test data memory to store the test data for a write test event or a read test event; and
                a state machine to obtain at least a part of the test data for a write test event or a read test event from the test data memory, the state machine to provide the at least a part of the test data for a write test event or a read test event to a formatter of the test interface, the formatter to format the test data for the DRAM memory to generate formatted test data, and
            a memory controller, the memory controller to receive the formatted test data from the test interface and to implement the write test event or read test event at the DRAM elements of the memory stack.

16. The system of claim 15, wherein the test interface further includes a comparator, the comparator to compare a data obtained from the memory stack in response to a read test event with an expected data.

17. The system of claim 15, wherein the system is a tablet computer.

18. A non-transitory computer-readable storage medium having stored thereon data representing sequences of instructions that, when executed by a processor, cause the processor to perform operations comprising:
    generating a test event by a built-in self-test (BIST) engine of a system element, the test event being a read test event or a write test event for a DRAM (dynamic random access memory) memory of a memory device;
    receiving the test data at a test interface of the system element, the test interface including a test data memory;
    storing the test data in the test data memory;
    obtaining from the test data memory by a state machine at least a portion of the test data for a write test event or a read test event;
    formatting the at least a portion of the test data in a format compatible with the DRAM memory to generate formatted test data;
    providing the formatted test data to a memory controller of the memory device; and
    implementing the write test event or read test event by the memory controller.

19. The memory device of claim 1, wherein the memory controller does not have information regarding a proper data format for the DRAM.

20. The memory device of claim 1, wherein the state machine is to operate independently of the BIST engine.

21. The memory device of claim 1, wherein the memory stack includes a plurality of memory die layers.

* * * * *